US010201969B2

United States Patent
Negishi et al.

(10) Patent No.: US 10,201,969 B2
(45) Date of Patent: Feb. 12, 2019

(54) RECORDING ELEMENT SUBSTRATE, LIQUID DISCHARGE HEAD, AND RECORDING APPARATUS

(71) Applicant: CANON KABUSHIKI KAISHA, Tokyo (JP)

(72) Inventors: Toshio Negishi, Yokohama (JP); Suguru Taniguchi, Kawasaki (JP); Kazunari Fujii, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/901,619

(22) Filed: Feb. 21, 2018

(65) Prior Publication Data
US 2018/0236762 A1   Aug. 23, 2018

(30) Foreign Application Priority Data
Feb. 22, 2017   (JP) .................................. 2017-031356

(51) Int. Cl.
*B41J 2/045*   (2006.01)
*B41J 2/175*   (2006.01)

(52) U.S. Cl.
CPC ......... *B41J 2/04541* (2013.01); *B41J 2/0455* (2013.01); *B41J 2/04523* (2013.01); *B41J 2/17546* (2013.01)

(58) Field of Classification Search
CPC .. B41J 2/04541; B41J 2/0455; B41J 2/17546; B41J 2/04523
See application file for complete search history.

(56) References Cited

U.S. PATENT DOCUMENTS

| | | | | |
|---|---|---|---|---|
| 2005/0285904 | A1* | 12/2005 | Toge | B41J 2/14072 347/58 |
| 2007/0008382 | A1* | 1/2007 | Hatsui | B41J 2/04541 347/61 |
| 2007/0091131 | A1* | 4/2007 | Hatsui | B41J 2/14072 347/11 |
| 2007/0103501 | A1* | 5/2007 | Hatsui | B41J 2/14072 347/20 |
| 2014/0078223 | A1* | 3/2014 | Ohmura | B41J 2/14016 347/56 |
| 2018/0236761 | A1* | 8/2018 | Taniguchi | B41J 2/04541 |

FOREIGN PATENT DOCUMENTS

JP   2014-58130 A   4/2014

* cited by examiner

*Primary Examiner* — Julian D Huffman
(74) *Attorney, Agent, or Firm* — Canon U.S.A., Inc. IP Division

(57) ABSTRACT

A recording element substrate includes a signal supply circuit and a common line which connects the signal supply circuit to first logic circuit array for a recording element and a second logic circuit array for a memory element in common. Furthermore, the first and second logic circuit arrays extend along a direction in which the common line extends, the first logic circuit array is disposed on one side of the common line, the second logic circuit array is disposed on the other side of the common line, and the first and second logic circuit arrays are arranged so that at least a portion of the first logic circuit array and a portion of the second logic circuit array overlap with each other in a direction orthogonal to the extending direction.

20 Claims, 12 Drawing Sheets

RECORDING ELEMENT SUBSTRATE, LIQUID DISCHARGE HEAD, AND RECORDING APPARATUS

BACKGROUND OF THE INVENTION

Field of the Invention

The present disclosure relates to a recording element substrate including memory elements, a liquid discharge head including the recording element substrate, and a recording apparatus which performs recording using the liquid discharge head.

Description of the Related Art

In general semiconductor substrates (recording element substrates), a poly fuse memory is generally used as an one time programmable (OTP) read only memory (ROM) which internally records unique information, such as a product ID or a setting parameter. Poly silicon which forms gate wiring or a resistance element of a transistor is used for the poly fuse memory, and has an advantage in that a memory is formed on a semiconductor substrate without additionally performing an existing semiconductor production process. As a reading/writing principle of the poly fuse memory, poly silicon wiring is fused for disconnection by heat generated due to a flow of current and a change of a resistance value is detected so as to be used as a memory.

The poly fuse memory requires a large control transistor which drives large current in a degree that the poly silicon wiring is fused for disconnection, and has a large area occupied by an element group (hereinafter also referred to as a "memory module") required for function of 1 bit of a memory. However, the number of memory bits required for a product is generally 32 to 48 bits, and therefore, an occupied area in the semiconductor substrate is approximately 5% or less.

However, in recent years, a large amount of memory (for example, approximately 128 bits or more) is required for higher accuracy control performed by an apparatus in addition to unique information, such as a product ID or a setting parameter. For example, in a case of a recording apparatus, a state of aging effect at a time of use, such as a recording material use amount, is required to be recorded inside a recording head.

Therefore, as a memory which realizes a memory module smaller than that of the poly fuse memory, Japanese Patent Laid-Open No. 2014-58130 discloses an anti-fuse memory (memory element). The anti-fuse memory has an advantage in that the anti-fuse memory may be generated by a general semiconductor production process without additionally performing a special process. The anti-fuse memory is formed by a gate oxide film of an MOS transistor, and an overvoltage is applied to the gate oxide film for short-circuit so that a change of a characteristic of the gate oxide film is used as a memory.

For example, in a case where an anti-fuse memory is used as a memory element, a logic circuit for the memory element which receives a signal transmitted from a signal supply circuit is provided to select a memory in which information is written.

If the number of memory elements mounted on a semiconductor substrate is increased, a region for mounting logic circuits corresponding to the memory elements and wiring for supplying signals to the logic circuits is also increased in addition to a region for mounting the memory elements. Accordingly, an area of the semiconductor substrate may be disadvantageously increased.

SUMMARY OF THE INVENTION

The present disclosure suppresses increase of an area of a semiconductor substrate in accordance with increase of the number of memory elements.

According to an embodiment of the present disclosure, a recording element substrate includes a plurality of recording elements, a first logic circuit array including arranged first logic circuits which correspond to the recording elements, a plurality of memory elements, a second logic circuit array including arranged second logic circuits which correspond to the plurality of memory elements, a signal supply circuit configured to supply a signal for controlling the plurality of recording elements and a signal for controlling the plurality of memory elements, and a common line configured to connect the signal supply circuit to the first logic circuit array and the second logic circuit array in common. The first and second logic circuit arrays extend along a direction in which the common line extends, the first logic circuit array is disposed on one side of the common line, the second logic circuit array is disposed on the other side of the common line, and the first and second logic circuit arrays are arranged so that at least a portion of the first logic circuit array and a portion of the second logic circuit array overlap with each other in a direction orthogonal to the extending direction.

Further features of the present disclosure will become apparent from the following description of exemplary embodiments with reference to the attached drawings.

DESCRIPTION OF THE EMBODIMENTS

Figure 7A:
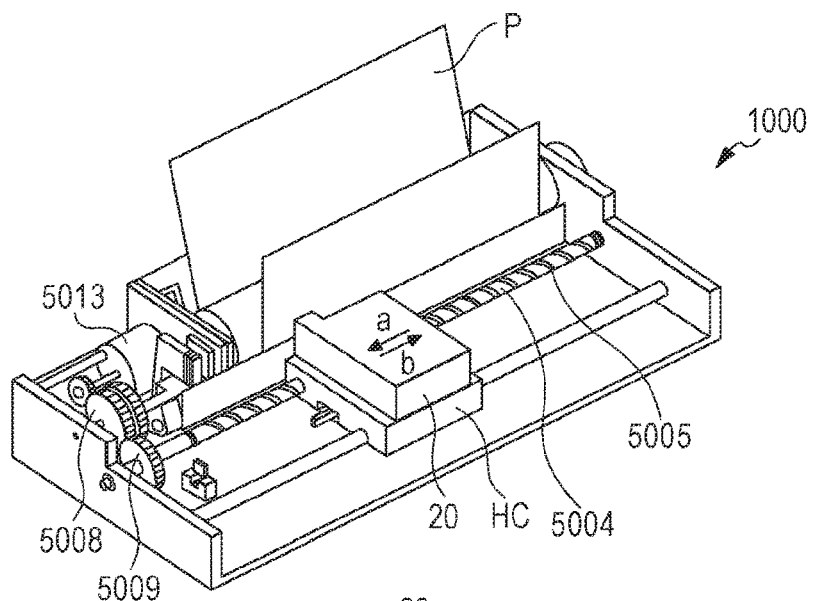
FIGS. 7A to 7C are diagrams schematically illustrating a recording head including a recording element substrate mounted thereon and a recording apparatus including the recording head mounted thereon.

Hereinafter, embodiments of the present disclosure will be described with reference to the accompanying drawings. Note that the embodiments below are merely examples of the present disclosure and do not limit the present disclosure.
Recording Apparatus, Recording Head Unit, and Recording Head FIG. 7A is a perspective view schematically illustrating a recording apparatus 1000 which includes a recording head unit 20 according to the present disclosure mounted thereon. As illustrated in FIG. 7A, a lead screw 5004 rotates in cooperation with positive and negative rotations of a driving motor 5013 through driving force transmission gears 5008 and 5009. A carriage HC may include the recording head unit 20 mounted thereon, includes a pin (not illustrated)

engaged with a helical channel 5005 of the lead screw 5004, and is moved in a reciprocate manner in directions denoted by arrow marks a and b when the lead screw 5004 rotates.

Figure 7B:
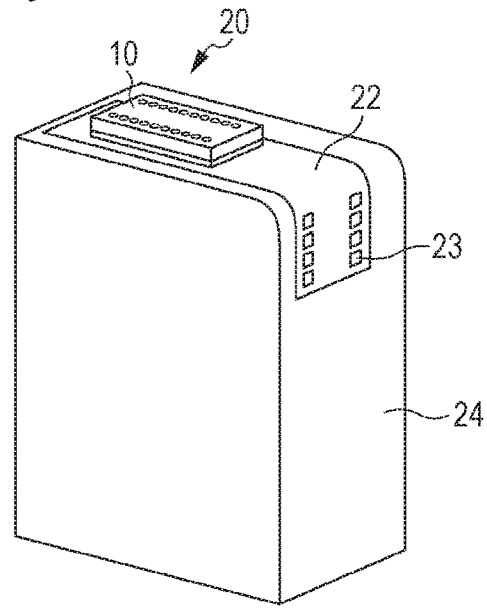

FIG. 7B is a perspective view illustrating the recording head unit 20 including a recording head 10 according to the present disclosure. The recording head unit 20 includes the recording head 10 and a cassette 24 which accommodates recording material to be supplied to the recording head 10 which are integrally configured as a cartridge. The recording head 10 is mounted on a surface which faces a recording medium P illustrated in FIG. 7A. Note that it is not necessarily the case that the recording head 10 and the cassette 24 are integrally configured, and the cassette 24 may be detachable. The recording head unit 20 includes a tape member 22. The tape member 22 includes a terminal used to supply electric power to the recording head 10 and transmits/receives electric power and various signals to/from a recording apparatus body through contacts 23.

Figure 7C:
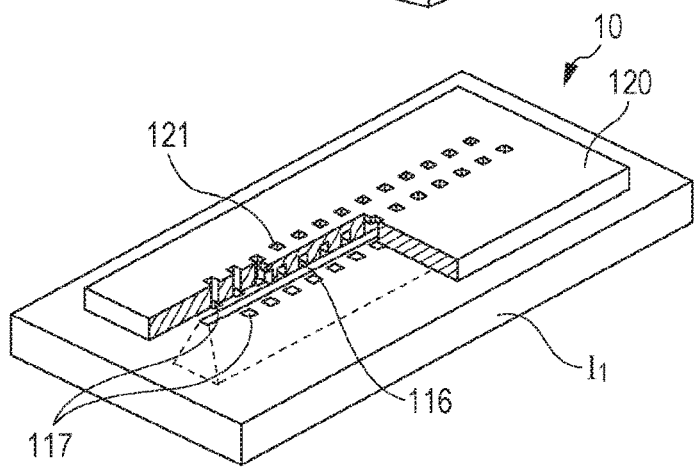

FIG. 7C is a perspective view schematically illustrating the recording head 10 according to the present disclosure. The recording head 10 as a liquid discharge head includes a recording element substrate $I_1$ and a channel forming member 120. The recording element substrate $I_1$ includes thermal action portions 117 which are arranged in a plurality of lines and which apply thermal energy generated by electro-thermal transducing element to the recording material. Furthermore, the channel forming member 120 also serves as a discharge port member in which discharge ports 121 which discharge the recording material are arranged in a plurality of lines so as to correspond to the thermal action portions 117. When electric power and signals are supplied from the recording apparatus body to the recording element substrate $I_1$ through the tape member 22 and thermal energy generated when the electro-thermal transducing element is driven is applied to the recording material (liquid) through the thermal action portions 117, the recording material is discharged from the discharge ports 121.

Recording Element Substrate

Figure 1:
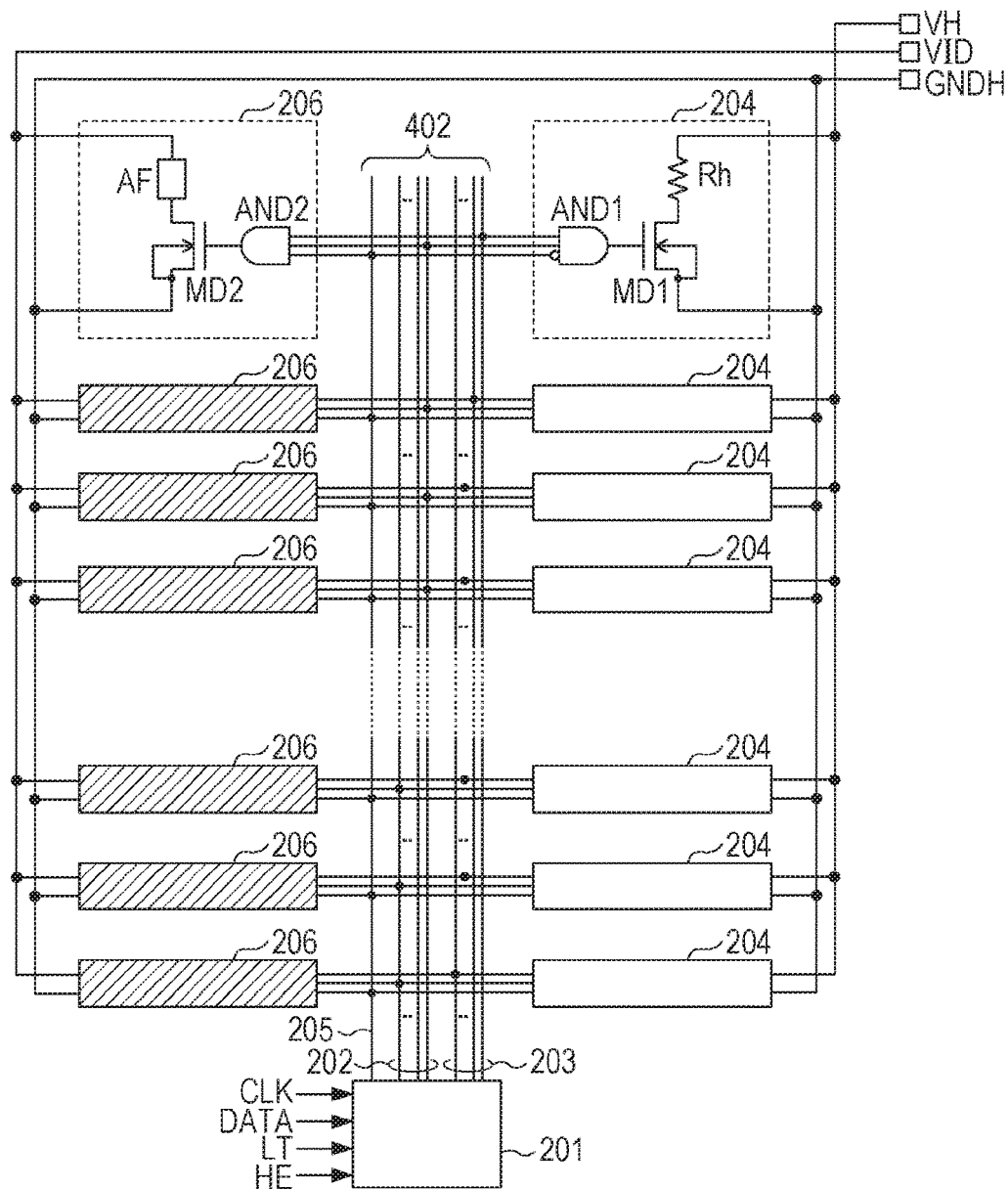
FIG. 1 is a diagram illustrating a circuit configuration of a portion of a recording element substrate according to a present disclosure.
Figure 2:
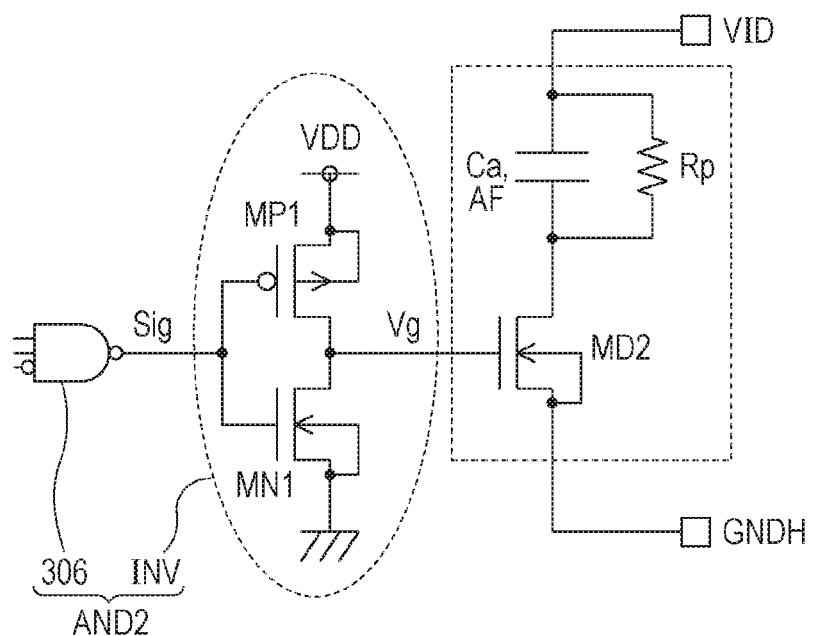
FIG. 2 is a diagram illustrating a configuration of a memory module applicable to the recording element substrate according to the present disclosure.
Figure 3:
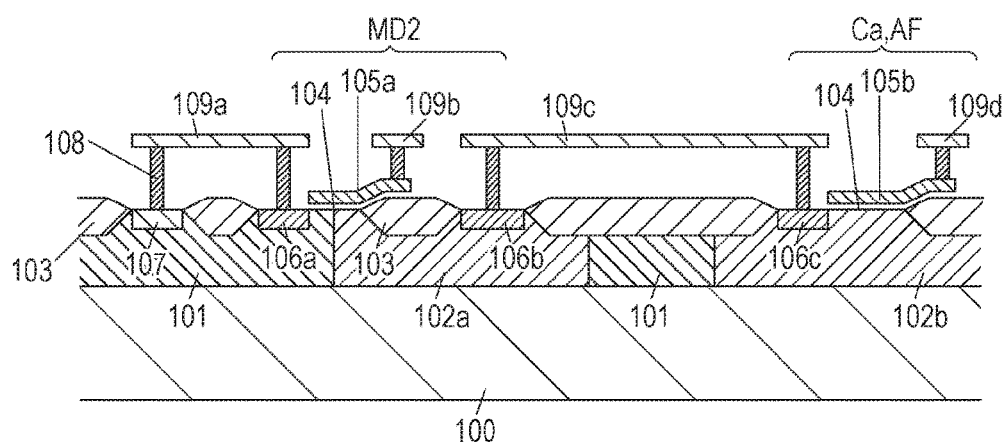
FIG. 3 is a cross-sectional view schematically illustrating the configuration of the memory module according to the present disclosure.

Referring to FIGS. 1 to 3, circuit configurations of a discharge module and a memory module which are mounted on a recording element substrate (hereinafter simply referred to as a "substrate" where appropriate) as a semiconductor substrate according to the present disclosure will be described.

FIG. 1 is a diagram illustrating a circuit configuration of a portion of the recording element substrate $I_1$. The recording element substrate $I_1$ includes discharge modules 204 and memory modules 206. Each of the discharge modules 204 includes a recording element Rh (an electro-thermal transducing element, for example), a driving element (transistor) MD1 for a recording element which drives the recording element Rh, and a logic circuit AND1 for selection of a recording element. The recording material, such as ink, is discharged by driving the recording element Rh so that recording is performed.

Furthermore, each of the memory modules 206 includes an anti-fuse element AF serving as a memory element, a driving element MD2 for a memory element which writes information in the anti-fuse element AF, and a logic circuit AND2 for selection of a memory element. The anti-fuse element AF fixedly holds information when overvoltage is supplied, and specifically, the anti-fuse element AF functions as a programmable memory only once.

Driving of the recording element Rh and the anti-fuse element AF is controlled in accordance with logical data transmitted from a control data supply circuit 201 serving as a signal supply circuit. The control data supply circuit 201 includes a shift register and a latch circuit, not illustrated, for example. Logical data signals, such as a clock signal CLK, an image data signal DATA, a latch signal LT, and a recording element control signal HE, may be supplied to the control data supply circuit 201 through a body of the recording apparatus 1000, a host PC, not illustrated, or the like. Furthermore, a first power source voltage VDD (3 to 5V, for example) is supplied as a logic power source voltage to the logic circuit AND1, the logic circuit AND2, and the control data supply circuit 201.

Here, the control data supply circuit 201 controls operation of the discharge modules 204 for each group in m groups each of which includes n discharge modules 204 so as to enable time divisional driving for driving the recording elements Rh. The control data supply circuit 201 outputs a block selection signal 202 of m bits and a time divisional selection signal 203 of n bits. The control data supply circuit 201 further outputs at least a switching signal 205 of 1 bit for performing switching between a recording element and a memory element. Each of the discharge modules 204 receives at least the block selection signal 202 of 1 bit, at least the time divisional selection signal 203 of 1 bit, and at least the switching signal 205 of 1 bit so that the recording element Rh is subjected to the time divisional driving.

Furthermore, the control data supply circuit 201 controls operation of the memory modules 206 for each group in y groups each of which includes x memory modules 206 so as to enable time divisional driving for driving the anti-fuse elements AF. Each of the memory modules 206 receives at least the block selection signal 202 of 1 bit, at least the time divisional selection signal 203 of 1 bit, and at least the switching signal 205 of 1 bit which are output from the control data supply circuit 201 so that the anti-fuse element AF is subjected to the time division driving. One of the anti-fuse elements AF included in the memory modules 206 to which information is to be written may be determined by the block selection signal 202, the time divisional selection signal 203, and the switching signal 205 based on the signals CLK, DATA, LT, and HE.

Note that the discharge modules 204 and the memory modules 206 are exclusively driven by the switching signal 205 so that all the recording elements Rh and all the anti-fuse elements AF are not driven in the same period of time. Specifically, the switching signal 205 is used to switch driving so that the recording elements Rh or the anti-fuse elements AF are driven. In a case where the switching signal 205 is 1 bit, the relationship between the number x of memory modules 206 and the number n of time divisional selection signals included in one memory group is denoted by "x≤n" and the relationship between the number y of memory groups and the number m of block selection signals is denoted by "y≤m". Furthermore, the switching signal 205 of several bits may be provided so that (n×m) anti-fuse elements AF or more are controlled.

The logic circuit AND1 receives the corresponding block selection signal 202, the corresponding time divisional selection signal 203, and the switching signal 205. The driving element MD1 for a recording element is brought to a conductive state in response to the input signals, and the recording element Rh which is connected to the driving element MD1 for a recording element in series is driven.

Here, as the driving element MD1 for a recording element, a double-diffused metal-oxide semiconductor field-effect transistor (MOSFET) (DMOS) transistor which is a high-voltage tolerant MOS transistor, for example, is used. When the anti-fuse element AF is used as the memory element, in general, a driving current of the memory element is smaller than a driving current of the recording element, and only small current driving capability is required for the DMOS transistor. Accordingly, an area of the driving element MD2 for a memory element may be smaller than an area of the driving element MD1 for a recording element.

Furthermore, as the logic circuit AND1 for selection of a recording element, a MOS transistor is used, for example. Here, a second power source voltage VH (24V, for example) is supplied as a power source voltage for driving of a recording element to the discharge modules 204 and a ground potential is denoted by "GNDH".

Furthermore, the logic circuit AND2 for selection of a memory element receives the corresponding block selection signal 202, the corresponding time divisional selection signal 203, and the switching signal 205. A signal corresponding to the input signals is output to the driving element MD2 for a memory element, and a conductive state and a nonconductive state of the driving element MD2 is switched. As the driving element MD2 for a memory element, a DMOS transistor is used, for example, similarly to the driving element MD1 for a recording element.

Furthermore, as the logic circuit AND2 for selection of a memory element, a MOS transistor is used. Here, a third power source voltage VID (24V, for example) for writing information in the anti-fuse elements AF is supplied to the memory modules 206 and a ground potential is denoted by "GNDH". As illustrated in FIG. 1, the driving element MD1 for a recording element and the driving element MD2 for a memory element may be connected to a common GNDH pad through a common ground line.

Note that, although a case where the power source voltages VID and VH are independent power source lines is described, when a smallest value of a voltage required for writing to the anti-fuse element AF is equal to or smaller than the power source voltage VH, the power source voltage VH may be used along with a step-down circuit, for example.

FIG. 2 is a diagram illustrating a configuration of the memory modules 206 used in the substrate $I_1$. In FIG. 2, the logic circuit AND2 for selection of a memory element is represented by a NAND circuit 306 and an inverter INV. The inverter INV includes a PMOS transistor MP1 and an NMOS transistor MN1, and a MOSFET transistor is used as the PMOS transistor MP1 and the NMOS transistor MN1. A signal Sig is input to the inverter INV, and a signal Vg is output to a gate of the driving element MD2 for a memory element. Note that arrangement of the driving element MD2 and the logic circuit AND2 illustrated in FIG. 1 is reversed in FIG. 2.

Before information is written, the anti-fuse element AF may function as a capacitative element Ca, for example. In FIG. 2, a state before information is written in the anti-fuse element AF is illustrated, and the anti-fuse element AF is represented as a capacitor Ca. Similarly, in the other drawings, the anti-fuse element AF is represented as the capacitor Ca where appropriate.

The capacitor Ca as the anti-fuse element AF has one terminal connected to the driving element MD2 for a memory element in series. Furthermore, the capacitor Ca has the other terminal to which a power source voltage VID is supplied when reading or writing is performed.

Furthermore, each of the memory modules 206 has a resistance element (having a resistance value Rp which is simply referred to as a "resistance element Rp" where appropriate hereinafter) which is connected to the anti-fuse element AF in parallel. By this, a case where information is mistakenly written in the anti-fuse element AF since overvoltage is applied to opposite ends of the anti-fuse element AF even though the driving element MD2 for a memory element is in a nonconductive state may be avoided.

FIG. 3 is a cross-sectional view of a portion of the recording element substrate $I_1$ including the capacitor Ca and the driving element MD2 for a memory element. For example, P-type well regions 101 and N-type well regions 102a and 102b are formed on a P-type silicon substrate 100. The P-type well regions 101 are formed simultaneously with a P-type well of the NMOS transistor MN1, and the P-type well and the P-type well regions 101 have the same impurity concentration distribution. The relationship between the N-type well regions 102a and 102b and an N-type well of the PMOS transistor MP1 is the same. Assuming that a breakdown voltage in a PN junction between the N-type well regions 102a and 102b and the P-type silicon substrate 100 is denoted by VB, VB is larger than VID so that breakdown does not occur in the PN junction when information is written. Therefore, the N-type well regions 102a and 102b are formed taking individual impurity concentrations into consideration.

In the P-type well regions 101 and the N-type well regions 102a and 102b, field oxide films 103, high concentration N-type diffusion regions 106a to 106c, and a high concentration P-type diffusion region 107 are formed. The field oxide films 103 have a LOCOS structure. The high concentration N-type diffusion regions 106a to 106c and the high concentration P-type diffusion region 107 may be formed simultaneously with high concentration diffusion regions for drains, sources, and bulks of the transistors MP1 and MN1. Furthermore, gate oxide films 104 included in the driving element MD2 and the capacitor Ca may be formed simultaneously with gate insulation films of the transistors MP1 and MN1. A gate electrode 105a of the driving element MD2 and an electrode 105b of the capacitor Ca used as the anti-fuse element AF are individually formed by poly silicon. The electrodes 105a and 105b may also be formed simultaneously with gate electrodes of the transistors MP1 and MN1.

A configuration of the driving element MD2 which is a high-voltage tolerant NMOS transistor will now be described. The gate electrode 105a is disposed through the gate oxide film 104 on the P-type well region 101 and the N-type well region 102a which are adjacent to each other. A region in which the P-type well region 101 and the gate electrode 105a overlap with each other serves as a channel region. The high concentration N-type diffusion region 106a is a source electrode, and the high concentration P-type diffusion region 107 is a back-gate electrode. The N-type well region 102a which extends in a lower portion of the gate electrode 105a is disposed as a drain electric field relaxing region. The high concentration N-type diffusion region 106b formed in the N-type well region 102a serves as a drain electrode. Furthermore, a drain side of the gate electrode 105a has a configuration in which the drain side runs on the field oxide film 103 formed in the N-type well region 102a, that is, a so-called offset configuration.

Accordingly, even when the driving element MD2 is in an OFF state, that is, even when a voltage of the gate electrode is GND and a voltage of the drain electrode increases to the high voltage VID, gate-drain voltage tolerance may be ensured.

Next, a configuration of the anti-fuse element AF (the capacitor Ca) will be described. The electrode 105b disposed on the N-type well region 102b through the gate oxide film 104 functions as an upper electrode of the anti-fuse element AF and the high concentration N-type diffusion region 106c functions as a lower electrode.

Although the high concentration N-type diffusion region 106c is formed only in an opening portion of the upper electrode in FIG. 3, the high concentration N-type diffusion region 106c may be formed on an entire lower portion of the upper electrode. Furthermore, although the lower electrode of the anti-fuse element AF is connected to the drain of the driving element MD2 in FIG. 3, the upper electrode may be connected to the drain of the driving element MD2 and the lower electrode may be connected to the high voltage VID.

Note that, although the capacitor Ca serving as the anti-fuse element AF is formed by the N well region and the poly silicon in FIG. 3, the present disclosure is not limited to this configuration and the capacitor Ca may be formed by a PMOS transistor.

Next, connection states of the individual electrodes will be described. A metal line 109a is connected to the source electrode and the back-gate electrode of the driving element MD2 through contact portions 108, and a GND potential is applied to the metal line 109a. A metal line 109b is connected to the gate electrode of the high-voltage tolerant NMOS transistor through a contact portion 108, and a signal Vg output from the inverter circuit illustrated in FIG. 2 is input to the metal line 109b. A metal line 109c is connected to the drain electrode of the driving element MD2 and the lower electrode of the anti-fuse element AF through a contact portion 108. A metal line 109d is connected to the upper electrode of the anti-fuse element AF through a contact portion 108, and the high voltage VID is applied to the metal line 109d when information is written. Note that the metal lines 109a to 109d and the electrodes are electrically connected to one another, and fabrication methods and configurations of the metal lines 109a to 109d and the individual electrodes are not limited.

Next, operation of the memory module 206 when information is written in the anti-fuse element AF will be described. When information is written in the anti-fuse element AF, a signal in a low level is input to the control signal Sig so that the driving element MD2 for a memory element is brought to an ON state. By this, the high voltage VID is applied to the gate oxide film of the anti-fuse element AF and the gate oxide film is broken so that information is written to the anti-fuse element AF. Specifically, although the anti-fuse element AF is the capacitor Ca before the information is written, the anti-fuse element AF is a resistance element after the information is written.

As a method for reading information written in the anti-fuse element AF, a method for measuring a change of an impedance of the anti-fuse element AF is employed, for example.

The information recorded in the anti-fuse element AF is information unique to a product, such as a chip ID or a setting parameter, and the information is written by an inspection machine or the like in a factory before shipping. Alternatively, when the information is written after the recording element substrate $I_1$ is mounted on a product body and a user starts use of the product, a voltage corresponding to the high voltage VID is supplied from the product body.

First Embodiment

Figure 4:
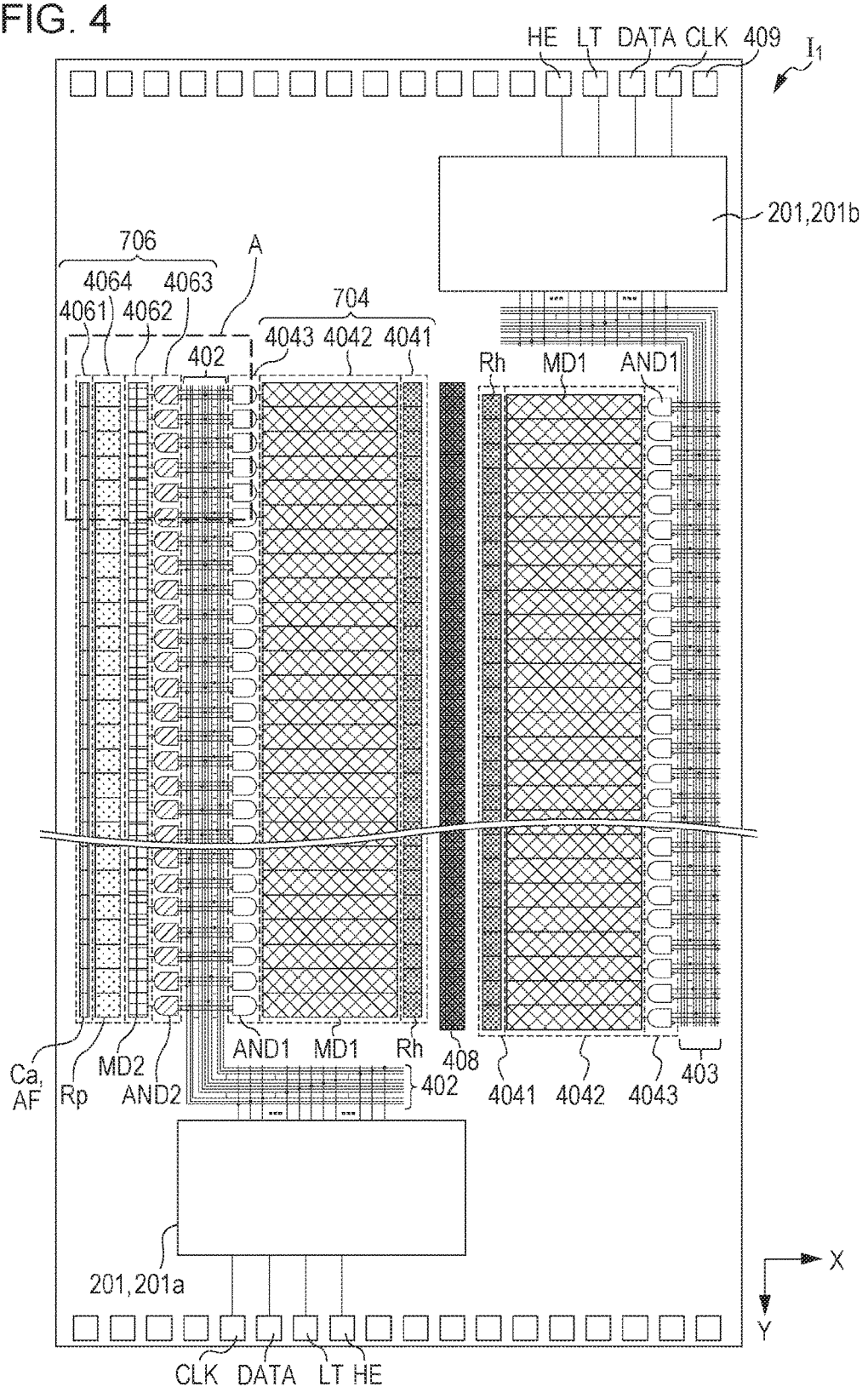
FIG. 4 is a plan view of a recording element substrate according to a first embodiment.

FIG. 4 is a plan view of the recording element substrate $I_1$ according to a first embodiment. The substrate $I_1$ includes the recording elements Rh, the driving elements MD1 for a recording element, and the logic circuits AND1 for selection of a recording element. The substrate $I_1$ further includes the anti-fuse elements AF (which are also represented as the "capacitors Ca" in FIG. 4) serving as memory elements, the driving elements MD2 for a memory element, and the logic circuits AND2 for selection of a memory element.

The substrate $I_1$ further includes a common logic bus line 402 (a common line) capable of supplying signals from the control data supply circuit 201 to the logic circuits AND1 and AND2. In this embodiment, the common logic bus line 402 includes the block selection signal line 202, the time divisional selection signal line 203, and the signal line 205 for switching between a recording element and a memory element which are output from the control data supply circuit 201.

Note that the configuration of the common logic bus line 402 is not limited to the configuration including all the signal lines described above, and at least one of the signal lines extending from the control data supply circuit 201 is shared by the logic circuits AND1 for selection of a recording element and the logic circuits AND2 for selection of a memory element. When at least one of the signal lines is shared by the logic circuits AND1 and AND2, a region of the logic bus line 402 may be reduced.

In particular, the discharge modules 204 and the memory modules 206 may be exclusively driven in accordance with a signal supplied from the control data supply circuit 201 as described above in this embodiment. Specifically, all the recording elements Rh and all the anti-fuse elements AF are not simultaneously driven. Accordingly, different logic bus lines are not required for the recording elements Rh and the anti-fuse elements AF, and a region of the logic bus line connected to the control data supply circuit 201 may be further reduced.

Next, arrangement of the elements on the recording element substrate $I_1$ will be described. A supply port 408 which supplies ink as recording material and which extends in a longitudinal direction of the substrate $I_1$ is disposed on the substrate $I_1$. A recording element array 4041 including at least an array of a plurality of recording elements Rh is disposed in a direction in which the supply port 408 extends. Furthermore, a driving element array 4042 for a recording element including an array of the driving elements MD1 for a recording element corresponding to the recording elements Rh is disposed adjacent to the recording element array 4041 on a side opposite to a side in which the supply port 408 is disposed relative to the recording element array 4041. Furthermore, a logic circuit array 4043 for selection of a recording element including an array of the logic circuits AND1 for selection of a recording element corresponding to the recording elements Rh is disposed adjacent to the driving element array 4042. Note that the recording element array 4041, the driving element array 4042, and the logic circuit array 4043 extend in a Y direction of FIG. 4 in this embodiment.

Similarly, an anti-fuse element array 4061 (a memory element array) including an array of a plurality of anti-fuse elements AF (capacitors Ca) is disposed on the substrate $I_1$ in the direction in which the recording element array 4041 extends. The anti-fuse element array 4061 is disposed in the vicinity of an edge portion of the substrate $I_1$. Furthermore, a resistance element array 4064 including an array of resistance elements Rp corresponding to the anti-fuse elements AF is disposed adjacent to the anti-fuse element array 4061. Moreover, a driving element array 4062 including an array of the driving elements MD2 for a memory element corresponding to the anti-fuse elements AF is disposed adjacent to the resistance element array 4064. Furthermore, a logic circuit array 4063 including an array of the logic circuits AND2 for selection of a memory element corresponding to the anti-fuse elements AF is disposed adjacent to the driving element array 4062.

The common logic bus line 402 described above is disposed between a discharge module array 704 including the recording element array 4041 and the arrays of elements and circuits for a recording element and a memory module array 706 including the memory element array 4061 and the arrays of elements and circuits for a memory element. The common logic bus line 402 extends in a direction in which the recording element array 4041 extends in this embodiment. Furthermore, the logic circuit array 4043 for a recording element and the logic circuit array 4063 for a memory element extend in a direction in which the common logic bus line 402 extends. Specifically, the common logic bus line 402, the logic circuit array 4043 for a recording element, and the logic circuit array 4063 for a memory element extend in the Y direction of FIG. 4. Furthermore, the logic circuit array 4063, the common logic bus line 402, and the logic circuit array 4043 are arranged in an X direction of FIG. 4 in this order. Furthermore, the control data supply circuit 201 (201a) is disposed in an end portion of the substrate $I_1$ in the Y direction.

As described above, according to this embodiment, the control data supply circuit 201 is connected to the logic circuits AND1 by a logic bus line which is the same as that connects the control data supply circuit 201 to the logic circuit AND2. Specifically, the common logic bus line 402 is commonly disposed so as to be shared by the discharge module 204 and the memory module 206. Furthermore, the logic circuit array 4043 including the logic circuits AND1 and the logic circuit array 4063 including the logic circuits AND2 extend in the direction in which the common logic bus line 402 extends. Moreover, the common logic bus line 402 is disposed between the logic circuit array 4043 and the logic circuit array 4063.

With this arrangement, a portion used as a dedicated line corresponding to one of the discharge modules 204 and the memory modules 206 in the common logic bus line 402 may be reduced or removed. Accordingly, even when the number of memory elements mounted on the substrate $I_1$ is increased, a length of the logic bus line may be suppressed and increase of a region occupied by the logic bus line in the substrate $I_1$ may be suppressed, and consequently, increase of an area of the substrate $I_1$ in accordance with increase of the number of memory elements may be suppressed.

Furthermore, the array of the discharge modules 204 (the discharge module array 704) is disposed on one side of the common logic bus line 402 and the array of the memory modules 206 (the memory module array 706) is disposed on the other side of the common logic bus line 402. Therefore, a large number of memory modules 206 may be mounted while increase of a length of the substrate $I_1$ in a direction in which the recording element array extends (the Y direction of FIG. 4) is suppressed.

Figure 5A:
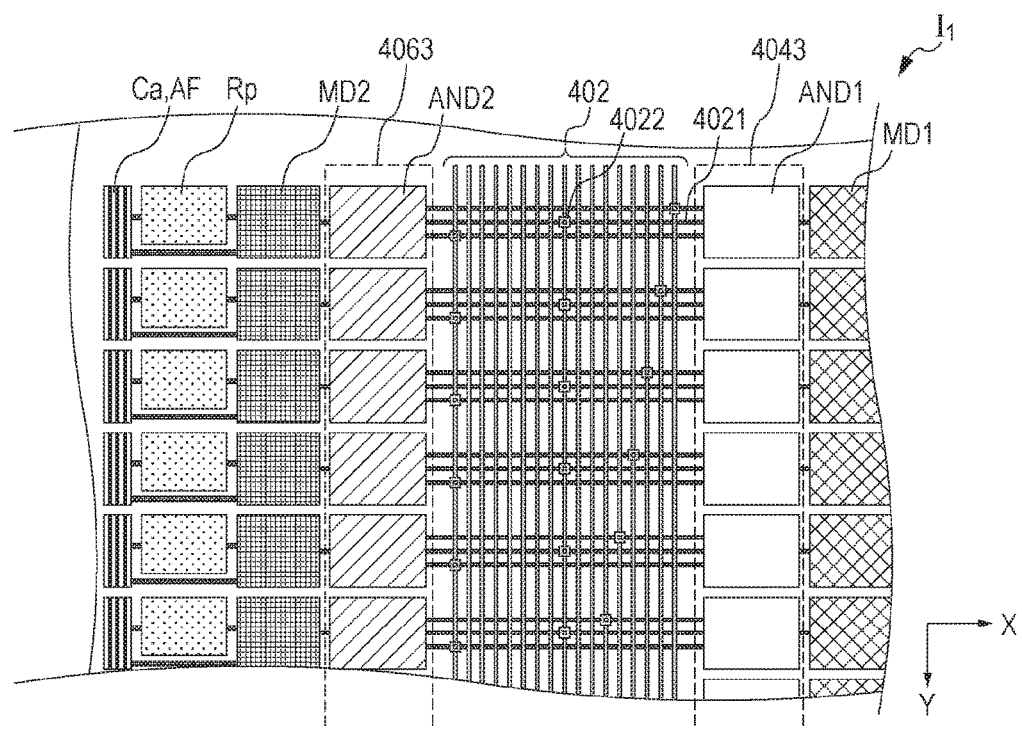
FIGS. 5A to 5C are enlarged views of the recording element substrate according to the first embodiment.

FIG. 5A is an enlarged view of a region A surrounded by a dotted line in FIG. 4. The common logic bus line 402, the logic circuits AND1 for selection of a recording element, and the logic circuits AND2 for selection of a memory element are electrically connected to one another through common signal lines 4021 connected to input nodes of the logic circuits AND1 and AND2. The common signal lines 4021 extend in a direction which intersects to (orthogonal to, in this embodiment) a direction in which the common logic bus line 402 extends. Furthermore, the plurality of common signal lines 4021 are used to individually connect the common logic bus line 402 and the logic circuits AND1 and the logic circuits AND2. The common logic bus line 402 and the common signal lines 4021 are formed in different wiring layers in a lamination direction of the substrate $I_1$, and the common logic bus line 402 is electrically connected to the common signal lines 4021 through via holes 4022. In the common signal lines 4021, first discrete wiring connects the via holes 4022 to the logic circuits AND1, and second discrete wiring connects the via holes 4022 to the logic circuits AND2. Accordingly, the via holes 4022 serve as a connection portion between the common logic bus line 402 and the first discrete wiring and also serve as a connection portion between the common logic bus line 402 and the second discrete wiring. Furthermore, the common signal lines 4021 are formed on the same wiring layer in the lamination direction of the substrate $I_1$.

Furthermore, in the configuration illustrated in FIG. 5A, the logic circuits AND1 included in the logic circuit array 4043 for selection of a recording element and the logic circuits AND2 included in the logic circuit array 4063 for selection of a memory element are arranged in the same pitch. Furthermore, the logic circuits AND1 and the corresponding logic circuits AND2 are arranged in parallel in a direction orthogonal to the common logic bus line 402 (an X direction). With this arrangement, the adjacent common signal lines 4021 are prevented from intersecting with each other while the plurality of common signal lines 4021 are formed in the same wiring layer. Note that it is not necessarily the case that all pitches between the logic circuits AND1 included in the logic circuit array 4043 and all pitches between the logic circuits AND2 included in the logic circuit array 4063 are the same as each other, and at least pitches between the adjacent logic circuits AND1 and pitches between the adjacent logic circuits AND2 are set equal to each other. Furthermore, the logic circuits AND1 and the logic circuits AND2 are arranged such that at least a number of the logic circuits AND1 and a number of the logic circuits AND2 overlap with each other in the X direction in FIG. 5A.

Figure 5B:
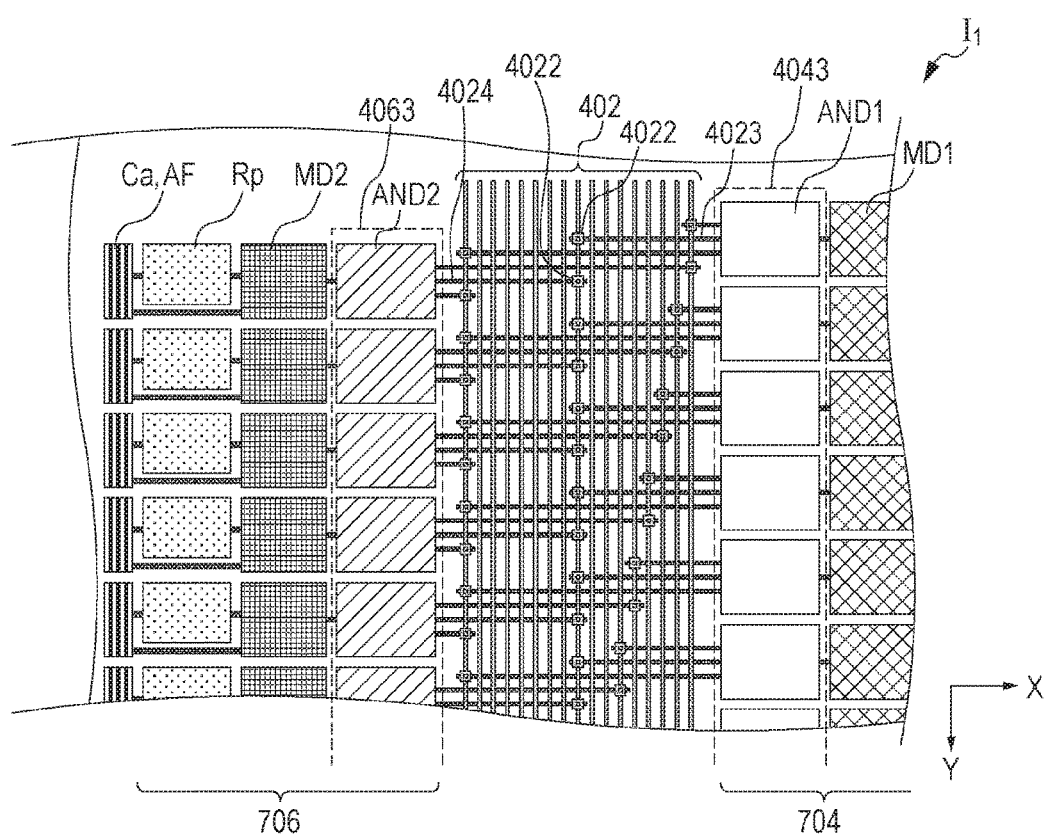

FIG. 5B is a diagram illustrating another example of the configuration illustrated in FIG. 5A. As illustrated in FIG. 5B, the logic circuit AND1 array 4043 and the logic circuit AND2 array 4063 may be shifted from each other in a direction of the recording element array 4041 (the Y direction) extends. Furthermore, the discharge module array 704 and the memory module array 706 may be shifted in the Y direction. Moreover, signal lines 4023 (first discrete wiring) which connect the common logic bus line 402 to the logic circuits AND1 and signal lines 4024 (second discrete wiring) which connect the common logic bus line 402 to the logic circuits AND2 may be individually provided. In this case, the via holes 4022 which connect the common logic bus line 402 to the signal lines 4023 and the via holes 4022 which connect the common logic bus line 402 to the signal lines 4024 are independently provided. Note that, to reduce the number of signal lines, the configuration in which the common signal lines 4021 connected using the common via holes are provided as illustrated in FIG. 5A is preferably employed.

Note that, according to the configuration of the embodiment described above, the anti-fuse elements serving as the memory elements may be most efficiently arranged, in particular, when the number of memory elements included in one memory element array is the same as the number of recording elements included in one recording element array. Note that the number of memory elements included in the memory element array may not be equal to the number of recording elements included in the recording element array. Specifically, a length of the recording element array and a length of the discharge element array may not be equal to each other, that is, the length of one of the arrays may be shorter than the length of the other of the arrays, so that another circuit may be disposed in a spare region.

Figure 5C:
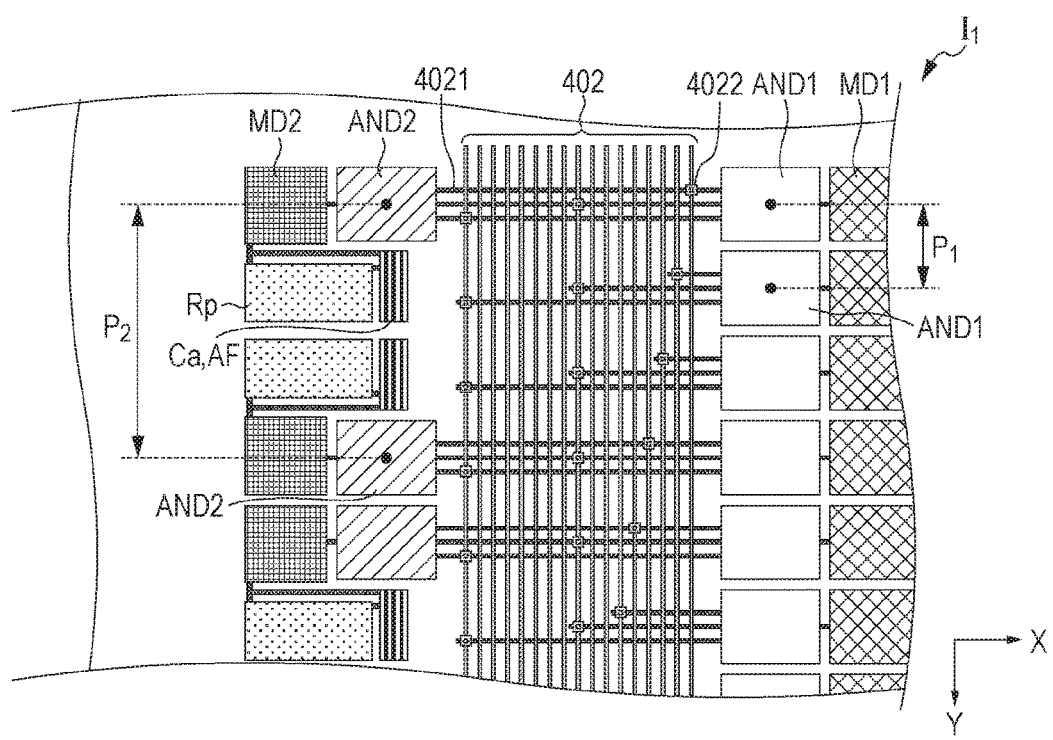

FIG. 5C is a diagram illustrating still another example of the configuration illustrated in FIG. 5A. In FIG. 5C, a case where the memory elements and the elements and the circuits for a memory element are efficiently arranged when the number of anti-fuse elements AF serving as the memory elements is smaller than that in FIG. 5A is illustrated.

For example, in the example illustrated in FIG. 5C, density of arrangement of the anti-fuse elements AF in the anti-fuse element array 4061 is reduced to half of density of arrangement of the recording elements included in the recording element array 4041. Specifically, the number of anti-fuse elements AF (the capacitors Ca) included in the one anti-fuse element array 4061 is half of the number of recording elements Rh included in the one recording element array 4041. Similarly, the number of driving elements MD2 for the anti-fuse elements AF and the number of logic circuits AND2 for the anti-fuse elements AF are also half of the number of driving element MD1 for the recording elements Rh and the number of logic circuits AND1 for the recording elements Rh, respectively. Furthermore, a pitch P2 of the logic circuits AND2 for the anti-fuse elements AF is three times as large as a pitch P1 of the logic circuits AND1 for the recording elements Rh. Then the capacitor Ca (the anti-fuse element AF) and the resistance element Rp are arranged in a region between the adjacent logic circuits AND2 for the memory elements.

According to this embodiment, the pitch P2 of the logic circuits AND2 for the anti-fuse elements AF is integral multiple of the pitch P1 of the logic circuits AND1 for the recording elements Rh. Although the number of mounted memory elements is reduced in this embodiment when compared with the foregoing embodiment, a length of the substrate $I_1$ in a direction (the X direction of the drawings in this embodiment) which intersects with the direction in which the recording element array 4041 extends may be reduced.

Note that, as illustrated in FIG. 4, the substrate $I_1$ includes the recording element array 4041, the driving element array 4042, and the logic circuit array 4043 in both sides (in the X direction) relative to the supply port 408. The one anti-fuse element array 4061 is arranged on one side relative to the supply port 408. Accordingly, one of the two recording element arrays 4041 (on a left side in FIG. 4) shares the common logic bus line 402 with the anti-fuse element array 4061. On the other hand, the other of the recording element arrays 4041 (on a right side in FIG. 4) is connected to the control data supply circuit 201 (201b) through a logic bus line 403 dedicated for the recording element array 4041. Note that the recording element array 4041, the driving element array 4042, and the logic circuit array 4043 may be disposed only one side relative to the supply port 408.

Note that the anti-fuse element is used as a memory element in this embodiment. When the anti-fuse element is used, a size of the memory module may be reduced when compared with the poly fuse memory. Furthermore, a gate oxide film formed by a semiconductor fabrication process of a substrate may be used as a gate oxide film forming the anti-fuse element, and the memory elements may be disposed without newly adding a process. Note that the memory element is not limited to the anti-fuse element.

Furthermore, in this embodiment, each of the memory modules 206 includes the resistance elements Rp which are provided to prevent information from being mistakenly written in the anti-fuse element AF as described above. Therefore, if incorrect writing may be avoided by a use condition or another unit, the resistance elements Rp may not be provided. Furthermore, although the recording elements Rh are electro-thermal transducer elements in this embodiment, the present disclosure is not limited to this and piezoelectric elements may be employed, for example. Moreover, although the recording element substrate including the recording elements Rh is described in this embodiment as an example of a semiconductor substrate, the present disclosure is applicable to an apparatus in which recording elements are disposed on another member or an apparatus which does not include any recording element.

Second Embodiment

A second embodiment is illustrated in FIGS. 6A to 6D. As with the foregoing embodiment, common logic bus lines 402 which connect a control data supply circuit 201 and logic circuits AND1 for selection of a recording element and logic circuits AND2 for selection of a memory element are provided in this embodiment. FIGS. 6A to 6D are plan views of a recording element substrate, and arrangement of a memory module array 706 including an array of a plurality of memory modules 206 will be described with reference to FIGS. 6A to 6D.

Note that concrete arrangement of a recording element array, a driving element array a recording element, and a logic circuit array for a recording element which are included in a discharge module array 704 illustrated in FIG. 6 is the same as that illustrated in FIG. 4. Furthermore, concrete arrangement of a memory element array, a driving element array for a memory element, and a logic circuit array for a memory element which are included in the memory module array 706 illustrated in FIG. 6 is the same as those illustrated in FIG. 4 and FIGS. 5A to 5C.

Figure 6A:
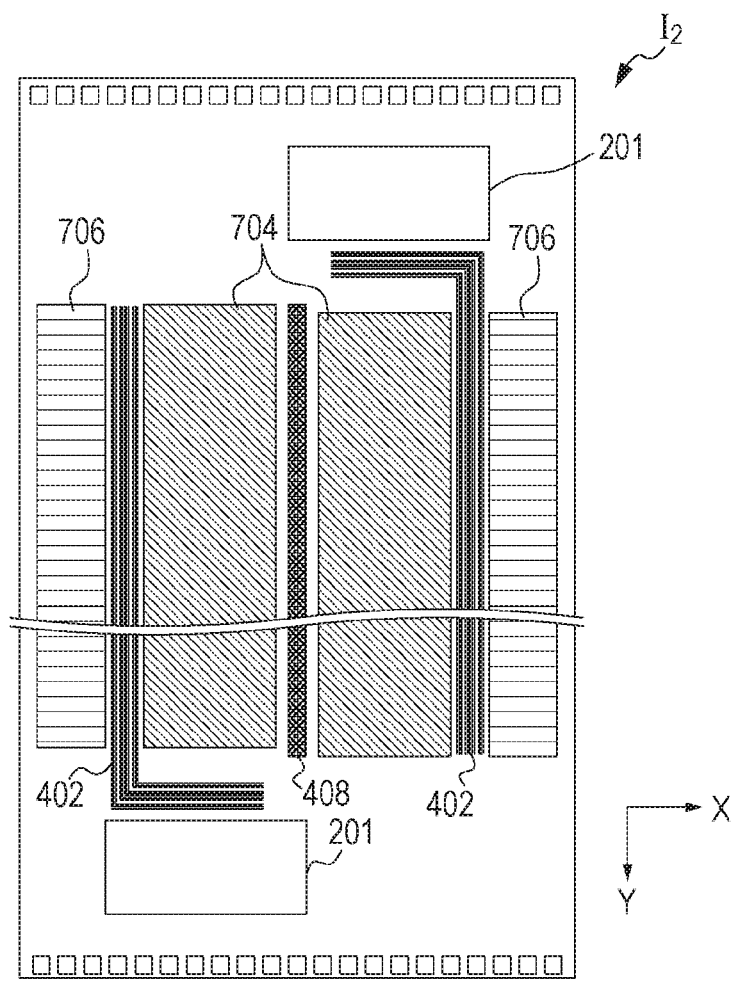
FIGS. 6A to 6D are plan views of a recording element substrate according to a second embodiment.

In FIG. 6A, the discharge module array 704 including an array of a plurality of discharge modules is disposed on both sides relative to a supply port 408 in an X direction. The memory module array 706 is disposed in opposite edge portions of a substrate $I_2$ so as to correspond to the discharge module arrays 704. Each of the memory module arrays 706 shares a common logic bus line 402 with corresponding one of the discharge module arrays 704. Furthermore, each of the two common logic bus lines 402 is sandwiched between an array of logic circuits AND1 for selection of a recording element and an array of logic circuits AND2 for selection of a memory element. In this way, since the plurality of memory module arrays 706 are provided, a larger number of memory elements may be disposed when compared with the foregoing embodiment.

Figure 6B:
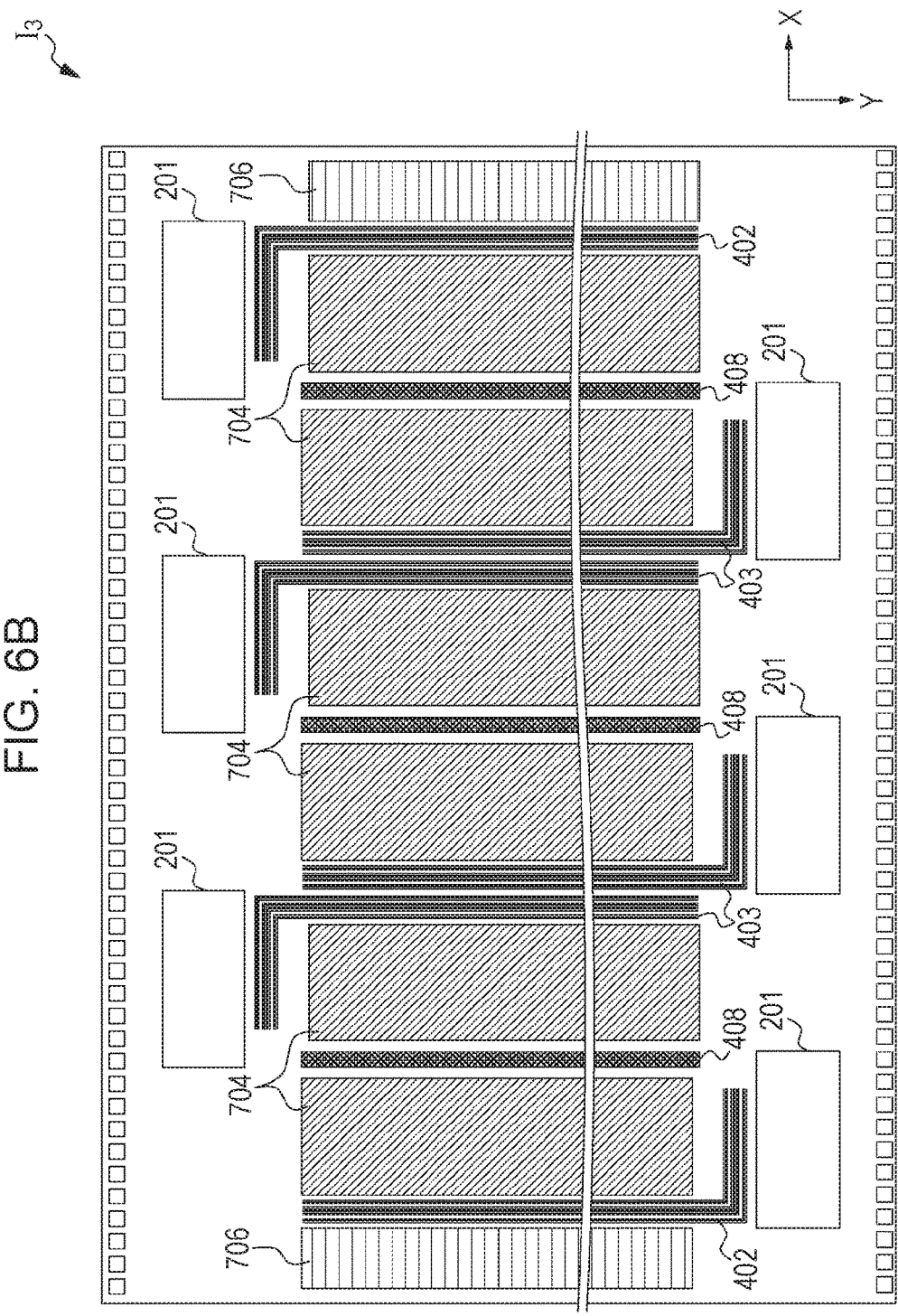

FIG. 6B is a plan view of a recording element substrate $I_3$ including a plurality of ink supply ports 408. As with FIG. 6A, a memory module array 706 is disposed in opposite edge portions of the substrate $I_3$. The substrate $I_3$ includes discharge module arrays 704 connected to common logic bus lines 402 which are shared by the memory module arrays 706 and discharge module arrays 704 connected to logic bus lines 403 dedicated for the discharge module arrays 704.

Figure 6C:
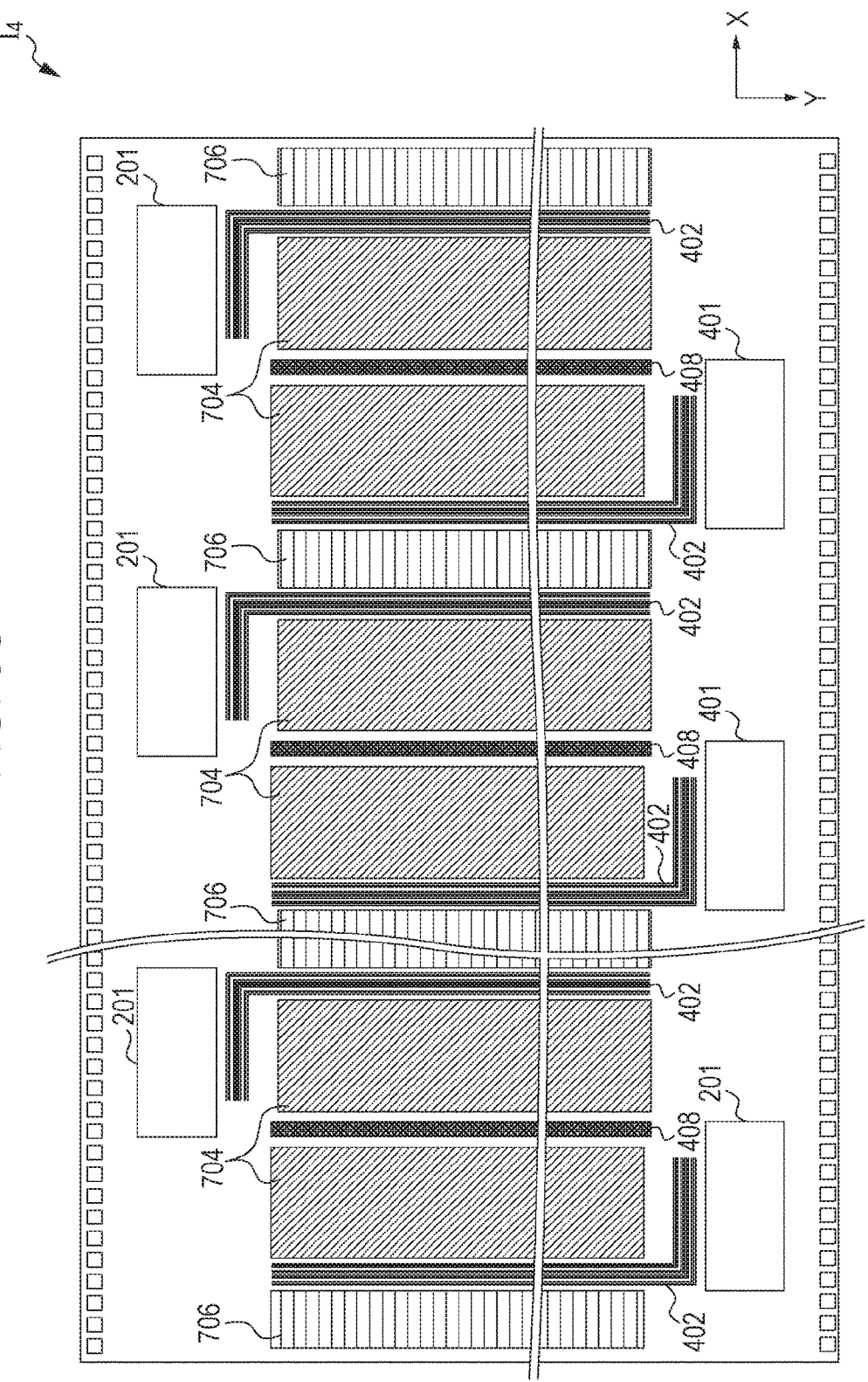

FIG. 6C is a plan view of a recording element substrate $I_4$, including a plurality of ink supply ports 408. On the substrate $I_4$, k ink supply ports 408 are arranged in an X direction of FIG. 6C, one memory module array 706 is disposed in opposite edge portions of the substrate $I_4$, and one memory module array 706 is disposed between each of the adjacent supply ports 408. Accordingly, (k+1) memory module arrays 706 are arranged on the substrate $I_4$. The memory module array 706 disposed between the two supply ports 408 is electrically connected to at least one of the common logic bus lines 402 which are arranged in the vicinity of both sides of the memory module array 706. In FIG. 6C, the number of memory elements may be larger than that of FIG. 6B.

Figure 6D:
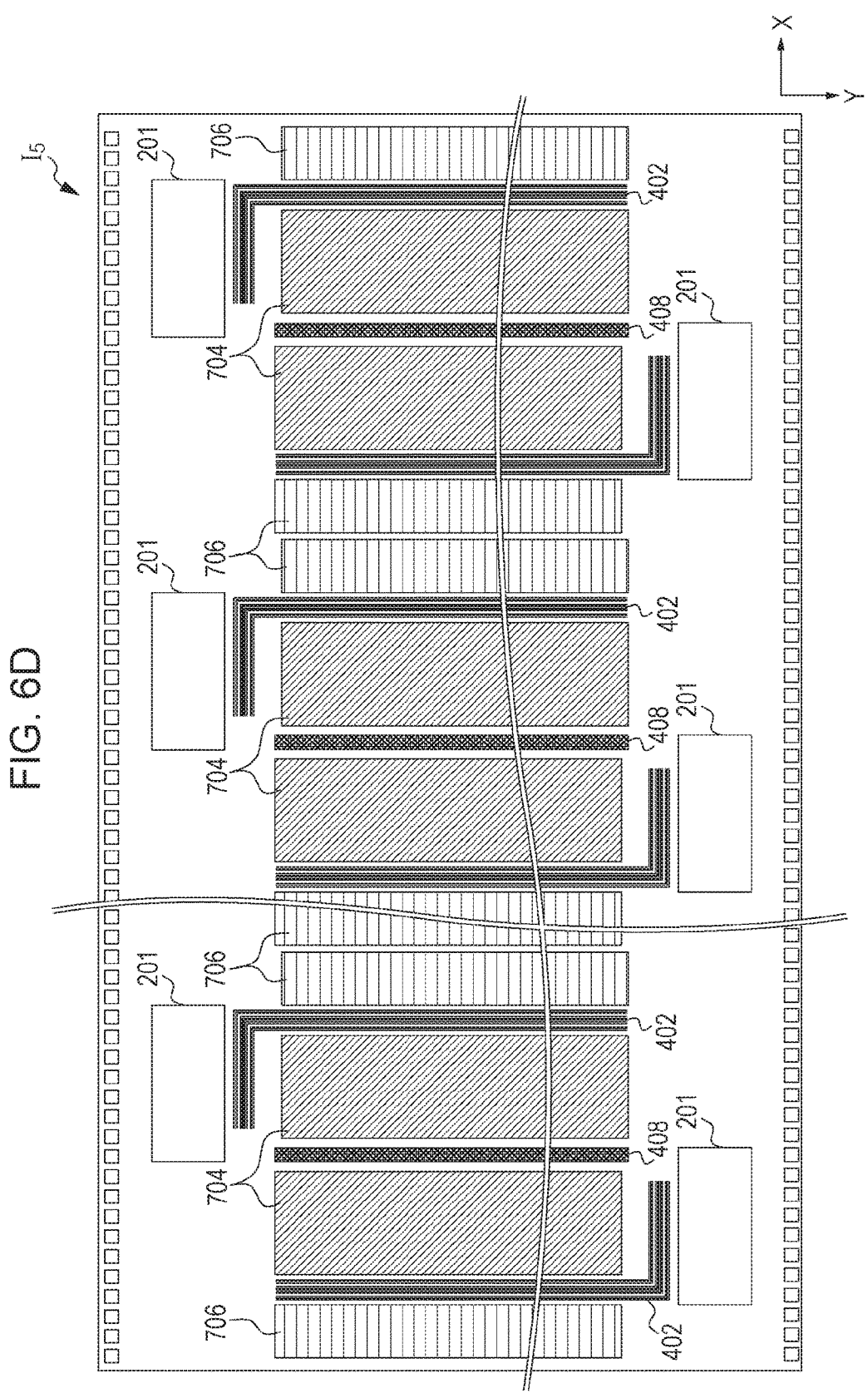

On a substrate $I_5$ illustrated in FIG. 6D, a plurality of memory module arrays 706 are arranged between adjacent ink supply ports 408 unlike the configuration illustrated in FIG. 6C. In FIG. 6D, the number of memory elements may be larger than that of FIG. 6C.

Note that, when the number of memory elements required in a substrate is smaller than the number of recording elements Rh included in one recording element array, one memory element array is preferably disposed so as to correspond to one of the recording element arrays as illustrated in FIG. 4. Specifically, memory elements are gathered in the same array as much as possible.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-031356 filed Feb. 22, 2017, which is hereby incorporated by reference herein in its entirety.

What is claimed is:

1. A recording element substrate comprising:
   a plurality of recording elements;
   a first logic circuit array which is an array of first logic circuits which correspond to the recording elements;
   a plurality of memory elements;
   a second logic circuit array which is an array of second logic circuits which correspond to the plurality of memory elements;
   a signal supply circuit configured to supply a signal for controlling the plurality of recording elements and a signal for controlling the plurality of memory elements; and
   a common line configured to connect the signal supply circuit to the first logic circuit array and the second logic circuit array in common,
   wherein the first and second logic circuit arrays extend along a direction in which the common line extends, the first logic circuit array is disposed on one side of the common line, the second logic circuit array is disposed on the other side of the common line, and the first and second logic circuit arrays are arranged so that at least a portion of the first logic circuit array and a portion of the second logic circuit array overlap with each other in a direction orthogonal to the extending direction.

2. The recording element substrate according to claim 1, wherein portions of the first logic circuits and portions of the second logic circuits overlap with each other in a direction orthogonal to the extending direction.

3. The recording element substrate according to claim 1, wherein each of the first logic circuits and the common line are connected to each other through a first discrete wiring which extends along a direction which intersects with the extending direction, and each of the second logic circuits and the common line are connected to each other through a second discrete wiring which extends along the intersecting direction.

4. The recording element substrate according to claim 1, wherein a connection portion of the first discrete wiring and the common line is the same as a connection portion of the second discrete wiring and the common line.

5. The recording element substrate according to claim 1, wherein the common line includes a line which supplies a signal for switching driving such that the plurality of recording elements or the plurality of memory elements are driven.

6. The recording element substrate according to claim 1, wherein the plurality of recording elements and the plurality of memory elements are exclusively driven in accordance with a signal supplied from the signal supply circuit.

7. The recording element substrate according to claim 1, wherein a pitch between adjacent first logic circuits is equal to a pitch between adjacent second logic circuits.

8. The recording element substrate according to claim 7, wherein a pitch between the first logic circuits in the first logic circuit array is equal to a pitch between the second logic circuits in the second logic circuit array.

9. The recording element substrate according to claim 1, wherein a pitch between the second logic circuits in the second logic circuit array is an integral multiple of a pitch between the first logic circuits in the first logic circuit array.

10. The recording element substrate according to claim 1, further comprising:
    first driving elements connected to the recording elements and the first logic circuits;
    second driving elements connected to the memory elements and the second logic circuits; and
    a ground line connected to the first and second driving elements in common.

11. The recording element substrate according to claim 1, wherein the signal supply circuit is disposed in an edge portion of the recording element substrate in the extending direction.

12. The recording element substrate according to claim 1, wherein the plurality of memory elements are anti-fuse elements.

13. The recording element substrate according to claim 1, comprising:
    a recording element array which is an array of the plurality of recording elements; and
    a memory element array which is an array of the plurality of memory elements.

14. The recording element substrate according to claim 13, wherein the number of recording elements included in the recording element array is equal to or larger than the number of memory elements included in the memory element array.

15. The recording element substrate according to claim 13, wherein the number of memory element arrays is smaller than the number of recording element arrays.

16. The recording element substrate according to claim 13, wherein the recording element array and the memory element array extend in the extending direction, the recording element array is disposed on a side opposite to a side in which the common line is disposed relative to the first logic circuit array, and the memory element array is disposed a side opposite to a side in which the common line is disposed relative to the second logic circuit array.

17. A liquid discharge head comprising:
    a recording element substrate including
       a plurality of recording elements,
       a first logic circuit array which is an array of first logic circuits which correspond to the recording elements,
       a plurality of memory elements,
       a second logic circuit array which is an array of second logic circuits which correspond to the plurality of memory elements, a signal supply circuit configured to supply a signal for controlling the plurality of recording elements and a signal for controlling the plurality of memory elements, and a common line configured to connect the signal supply circuit to the first logic circuit array and the second logic circuit array in common, and a discharge port member including discharge ports corresponding to the plurality of recording elements, wherein the first and second logic circuit arrays extend along a direction in which the common line extends, the first logic circuit array is disposed on one side of the common line, the second logic circuit array is disposed on the other side of the common line, and the first and second logic circuit arrays are arranged so that at least a portion of the first logic circuit array and a portion of the second logic circuit array overlap with each other in a direction orthogonal to the extending direction.

18. The liquid discharge head according to claim 17, wherein a portion of the first logic circuit and a portion of the second logic circuit overlap with each other in a direction orthogonal to the extending direction.

19. The liquid discharge head according to claim 17, wherein each of the first logic circuits and the common line are connected to each other through a first discrete wiring which extends along a direction which intersects with the extending direction, and each of the second logic circuits and the common line are connected to each other through a second discrete wiring which extends in the intersecting direction.

20. A recording apparatus which performs recording using a liquid discharge head comprising:
    a recording element substrate including
        a plurality of recording elements,
        a first logic circuit array which is an array of first logic circuits which correspond to the plurality of recording elements,
        a plurality of memory elements,
        a second logic circuit array which is an array of second logic circuits which correspond to the plurality of memory elements,
        a signal supply circuit configured to supply a signal for controlling the plurality of recording elements and a signal for controlling the plurality of memory elements, and
        a common line configured to connect the signal supply circuit to the first logic circuit array and the second logic circuit array in common, and
    a discharge member including discharge ports corresponding to the plurality of recording elements,
    wherein the first and second logic circuit arrays extend along a direction in which the common line extends, the first logic circuit array is disposed on one side of the common line, the second logic circuit array is disposed on the other side of the common line, and the first and second logic circuit arrays are arranged so that at least a portion of the first logic circuit array and a portion of the second logic circuit array overlap with each other in a direction orthogonal to the extending direction.

* * * * *